United States Patent
Kimura

(10) Patent No.: US 8,115,496 B2
(45) Date of Patent: Feb. 14, 2012

(54) INSULATION COATED CONDUCTOR INSPECTION METHOD AND INSPECTION APPARATUS

(75) Inventor: Hideaki Kimura, Anjo (JP)

(73) Assignee: Aisin AW Co., Ltd., Aichi-Ken (JP)

( * ) Notice: Subject to any disclaimer, the term of this patent is extended or adjusted under 35 U.S.C. 154(b) by 439 days.

(21) Appl. No.: 12/470,837

(22) Filed: May 22, 2009

(65) Prior Publication Data

US 2009/0322345 A1 Dec. 31, 2009

(30) Foreign Application Priority Data

Jun. 25, 2008 (JP) .................. 2008-165435

(51) Int. Cl.
*G01R 27/00* (2006.01)
*G01R 31/06* (2006.01)
(52) U.S. Cl. ............ 324/551; 324/546; 324/600
(58) Field of Classification Search ............ 324/522, 324/545–547, 551–554, 557, 600, 772
See application file for complete search history.

(56) References Cited

U.S. PATENT DOCUMENTS 7,688,076 B2 * 3/2010 Aihara et al. ............... 324/522

FOREIGN PATENT DOCUMENTS

| JP | 5-49065 B2 | | 7/1993 |
| JP | 7-128392 | * | 5/1995 |
| JP | 7-128392 A | | 5/1995 |
| JP | 7-32577 U | | 6/1995 |
| JP | 2005-121442 A | | 5/2005 |
| JP | 2007-121002 A | | 5/2007 |
| JP | 2007-121003 A | | 5/2007 |
| JP | 2007-240160 A | | 9/2007 |

* cited by examiner

*Primary Examiner* — Melissa J Koval
*Assistant Examiner* — Farhana Hoque
(74) *Attorney, Agent, or Firm* — Sughrue Mion, PLLC

(57) ABSTRACT

In an insulation coated conductor inspection method for inspecting an electrical insulation characteristic of an insulation coated conductor in a coil formed by winding the insulation coated conductor, the coil is disposed in a test container, an internal pressure of the test container is reduced, an electrodes are provided so as to face the coil with a gap therebetween, an alternating-current voltage is applied between the electrodes and the coil, a generation frequency of a discharge that is generated between the coil and the electrodes upon application of the alternating-current voltage is measured, and the coil is determined to be a non-defective product having a superior electrical insulation property when the generation frequency of the discharge is higher than a reference generation frequency and determined to be a defective product having a defective electrical insulation property when the generation frequency of the discharge is lower than the reference generation frequency. A predetermined range is preferably set as a range in which a discharge charge amount is no greater than 100,000 (pc).

16 Claims, 7 Drawing Sheets

INSULATION COATED CONDUCTOR INSPECTION METHOD AND INSPECTION APPARATUS

INCORPORATION BY REFERENCE

The disclosure of Japanese Patent Application No. 2008-165435 filed on Jun. 25, 2008 including the specification, drawings and abstract is incorporated herein by reference in its entirety.

BACKGROUND OF THE INVENTION

The present invention relates to a method for inspecting an electrical insulation characteristic of an insulation coated conductor forming a coil for a motor or the like in an non-destructive condition.

Description of the Related Art

For example, in a product including a coil for an electric motor or the like, an inspection is preferably performed on each of the insulation coated conductors constituting the coil to determine whether or not an electrical insulation performance thereof has decreased due to breakage of an insulating film and so on. Conventionally, a so-called destructive inspection, in which products to be tested are extracted from a large number of products at a predetermined ratio, inspected, and then discarded, has been employed predominantly as this type of inspection. Meanwhile, various non-destructive inspection methods have been proposed in the related art.

For example, in a non-destructive inspection method for detecting insulation defects in a low-pressure rotary machine described in Japanese Examined Patent Application Publication JP-B-H5-49065, an inspection is performed by reducing the internal pressure of a vacuum container, introducing a volatile gas into the container, applying a direct-current voltage between a coil and a conductive detection electrode to achieve electrification, and coloring an arc generated between a damaged part of the coil and the conductive detection electrode to make the arc visible.

Further, in a non-destructive insulation testing apparatus described in Japanese Patent Application Publication JP-A-H7-128392, a voltage is applied between a coil and a stator core after reducing the internal pressure of a vacuum container, a corona discharge charge amount is detected, a discharge frequency is counted, and a pass/fail determination is made. More specifically, in the pass/fail determination, the range of the applied voltage is set between 500V and 800V, and when the frequency of a discharge having a charge of at least approximately 1000×103 pC (picocoulomb) equals or exceeds 20 pps, a product is determined to be defective.

SUMMARY OF THE INVENTION

However, although the method of Japanese Examined Patent Application Publication JP-B-H5-49065 is described as a non-destructive inspection method, when mercury or naphthalene, both of which are cited as examples, is used as the volatile gas, it is practically impossible to remove these gases after the test, and therefore the products used in the test must be discarded. Moreover, the inspection is visual, and therefore important defects may be overlooked.

Further, in the method of Japanese Patent Application Publication JP-A-H7-128392, it is stated that an inspection cannot be performed on the coil when the coil is positioned at a remove from the stator core. Therefore, in the case of Japanese Patent Application Publication JP-A-H7-128392, for example at a coil end portion, an inspection cannot be performed on an end portion that is removed from the stator core by a certain distance, and as a result, only parts in close proximity to a rise portion rising from the core can be inspected.

The present invention has been designed in consideration of these problems in the related art, and it is an object thereof to provide an insulation coated conductor inspection method and apparatus having a higher inspection precision than the related art, with which even a site furthest removed from a stator core can be inspected during an inspection of a stator, for example.

According to a first aspect of the present invention, an insulation coated conductor inspection method for inspecting an electrical insulation characteristic of an insulation coated conductor in a coil formed by winding the insulation coated conductor, includes: disposing the coil in a test container; reducing an internal pressure of the test container; providing an electrode so as to face the coil with a gap therebetween; applying an alternating-current voltage between the electrode and the coil; measuring a generation frequency of a discharge that is generated between the coil and the electrode upon application of the alternating-current voltage; and determining that the coil is a non-defective product having a superior electrical insulation property when the generation frequency of the discharge is higher than a reference generation frequency and that the coil is a defective product having a defective electrical insulation property when the generation frequency of the discharge is lower than the reference generation frequency.

As described above, in the insulation coated conductor inspection method according to the first aspect of the present invention, the electrode faces the coil with a gap therebetween, and an alternating-current voltage is applied between the coil and the electrode under reduced pressure. The most important point of the first aspect of the present invention based on this voltage application method is the active employment of a special determination method not present in the related art, according to which the coil is determined to be a non-defective product having a superior electrical insulation property when the generation frequency of the discharge is higher than the reference generation frequency and determined to be a defective product having a defective electrical insulation property when the generation frequency of the discharge is lower than the reference generation frequency.

More specifically, in the aforementioned related art and so on, a defect is determined when discharge is generated from a damaged part of an insulation film of the insulation coated conductor or when the discharge frequency at a predetermined charge amount is high. In contrast, the inspection method of the first aspect of the present invention is based on the specific voltage application method described above, and therefore the electrical insulation property is determined to be defective when the discharge generation frequency is low.

The first aspect of the present invention will be described in detail in the following embodiments. And, the first aspect of the present invention is considered to be superior for the following reasons.

When a predetermined alternating-current voltage is applied between the coil and the electrode, a large number of discharges having comparatively small charge amounts are generated even from a part (a healthy part) in which the insulation film is healthy and the electrical insulation property is normal. On the other hand, when damage or the like exists on the insulation film such that a site (a defective portion) exhibiting an extremely poor electrical insulation property exists, a discharge having a comparatively large charge amount is generated from this site. Conversely, it has been found that when this type of defective portion exists, the discharge frequency at a comparatively small charge amount from the healthy portion decreases greatly.

Here, the electrical insulation property may be determined by determining a defect when the discharge generation frequency at a comparatively large charge amount is high. However, the determination precision can be increased by determining that the electrical insulation property is defective when the discharge generation frequency at a predetermined charge amount or a charge amount within an entire measured range is low. The first aspect of the present invention employs the latter method.

Further, the first aspect of the present invention can be applied to either a single coil or a coil attached to a coil material other than a stator core, and by selecting a disposal position of the electrode appropriately, a desired position of the coil can be inspected. When the inspection subject is a stator to be described below, a voltage is applied between the coil and the electrode, and therefore, by setting the electrode position in a desired position, a site furthest removed from the stator core can also be inspected.

According to a second aspect of the present invention, an insulation coated conductor inspection apparatus for inspecting an electrical insulation characteristic of an insulation coated conductor in a coil formed by winding the insulation coated conductor, includes: a test container accommodating the coil; a pressure reducing unit for reducing an internal pressure of the test container; an electrode that faces the coil with a gap therebetween; a voltage applying unit for applying an alternating-current voltage between the electrode and the coil; a discharge measuring unit for measuring a generation frequency of a discharge that is generated between the coil and the electrode upon application of the alternating-current voltage; and a determining unit for determining that the coil is a non-defective product having a superior electrical insulation property when the generation frequency of the discharge is higher than a reference generation frequency and that the coil is a defective product having a defective electrical insulation property when the generation frequency of the discharge is lower than the reference generation frequency.

When the insulation coated conductor inspection apparatus according to the second aspect of the present invention is used, the inspection method described above can be implemented reliably, and in so doing, the electrical insulation property of the coil can be inspected with a higher degree of precision than is achieved in the related art.

DETAILED DESCRIPTION OF THE EMBODIMENTS

Figure 1:
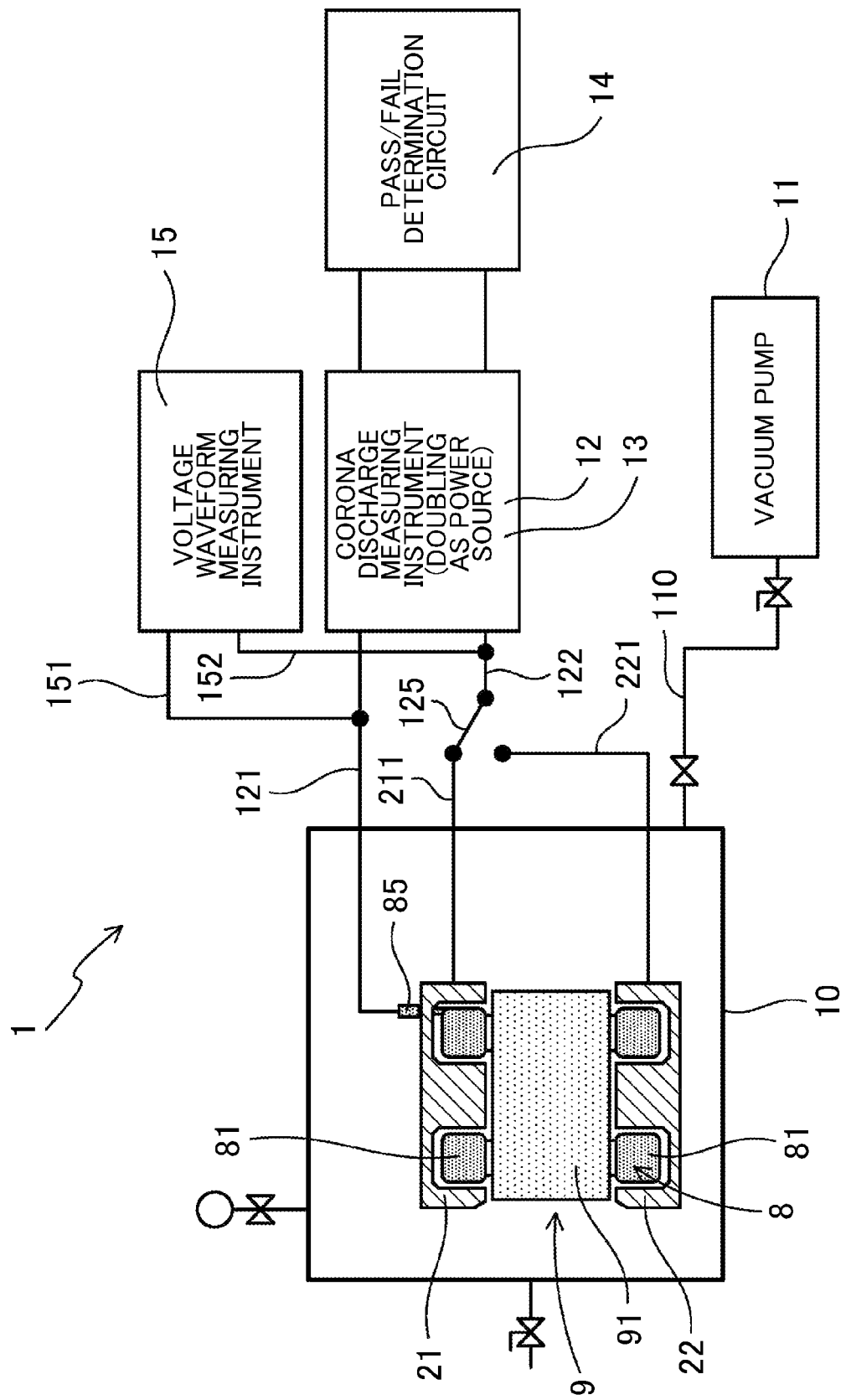
FIG. 1 is an illustrative view showing the constitution of an insulation coated conductor inspection apparatus according to a first embodiment.

In the first aspect and the second aspect of the present invention, the discharge generation frequency is determined at a charge amount within a predetermined range or an entire measurement range. In principle, the charge amount range may be set as the entire measurement range, but since comparatively small charge amounts have a higher generation frequency, the charge amount range is preferably limited to a predetermined range of comparatively small charge amounts.

More specifically, after measuring the discharge charge amount of the discharge, the generation frequency is preferably measured within a range in which the discharge charge amount is no more than 100,000 (pc). Within this range, non-defective and defective products can be differentiated clearly.

More preferably, the discharge charge amount of the discharge is measured, and the range of the discharge charge amount is set at no more than 10,000 (pc). Within this range, non-defective and defective products can be differentiated clearly.

Note that the range having an upper limit of 10,000 (pc), for example, may be a charge amount range of 0 to 10,000 (pc), a narrower range of 100 to 500 (pc), an even narrower range of 200±10 (pc), or any other range in which measurement can be performed easily, for example.

Further, the coil is preferably attached to a stator core. In a stator incorporated into a motor or the like, for example, the coil is attached to the stator core, and during an operation to attach the coil, damage or the like may occur on the insulating film of the insulation coated conductor. Therefore, the present invention is extremely effective.

Further, the electrode preferably faces a coil end portion protruding from an end portion of the stator core, and the generation frequency of a discharge generated between the coil end portion and the electrode is preferably measured. In this case, an inspection can be performed easily on the coil end portion, in which defects are likely to occur.

Further, the electrode is preferably formed with a substantially C-shaped cross-section so as to surround the coil end portion. In this case, the coil end portion can be inspected easily and accurately.

Further, application of the alternating-current voltage between the electrode and the coil is preferably performed on the coil a plurality of times while partially shifting a test site such that the determination is performed in each test site. In so doing, an insulation defect portion can be specified in test site units, which helps to identify the cause of the defect.

Further, various specific apparatus constitutions may be employed to realize determination in each of a plurality of test sites, but as a preferable example, the electrode faces a part of the coil and is capable of moving relative to the coil such that the test site can be modified by causing the electrode to move relative to the coil.

In another preferable example, the electrode is divided into a plurality of divided electrodes such that the test site can be modified by modifying the electrode to which the voltage is applied successively. A structure in which the electrodes are both divided and made capable of relative movement may also be employed.

Further, when implementing the insulation coated conductor inspection method described above, it is important to reduce the internal pressure of the test container as described above in order to reduce the discharge voltage in accordance with the so-called Paschen's Law. A favorable reduced pressure condition for generating an appropriate discharge is 1 to 3 (Torr), or in other words approximately 133 to 400 (Pa).

Further, the gap between the coil and the electrode is preferably within a range of 3 to 30 mm. When the gap is smaller than 3 mm, the insulating film may be damaged by contact between the coil end portion and the electrode, and when the gap exceeds 30 mm, it becomes difficult to generate a discharge.

Embodiments

First Embodiment

An insulation coated conductor inspection method and apparatus according to an embodiment of the present invention will now be described using FIGS. 1 to 5.

Figure 2:
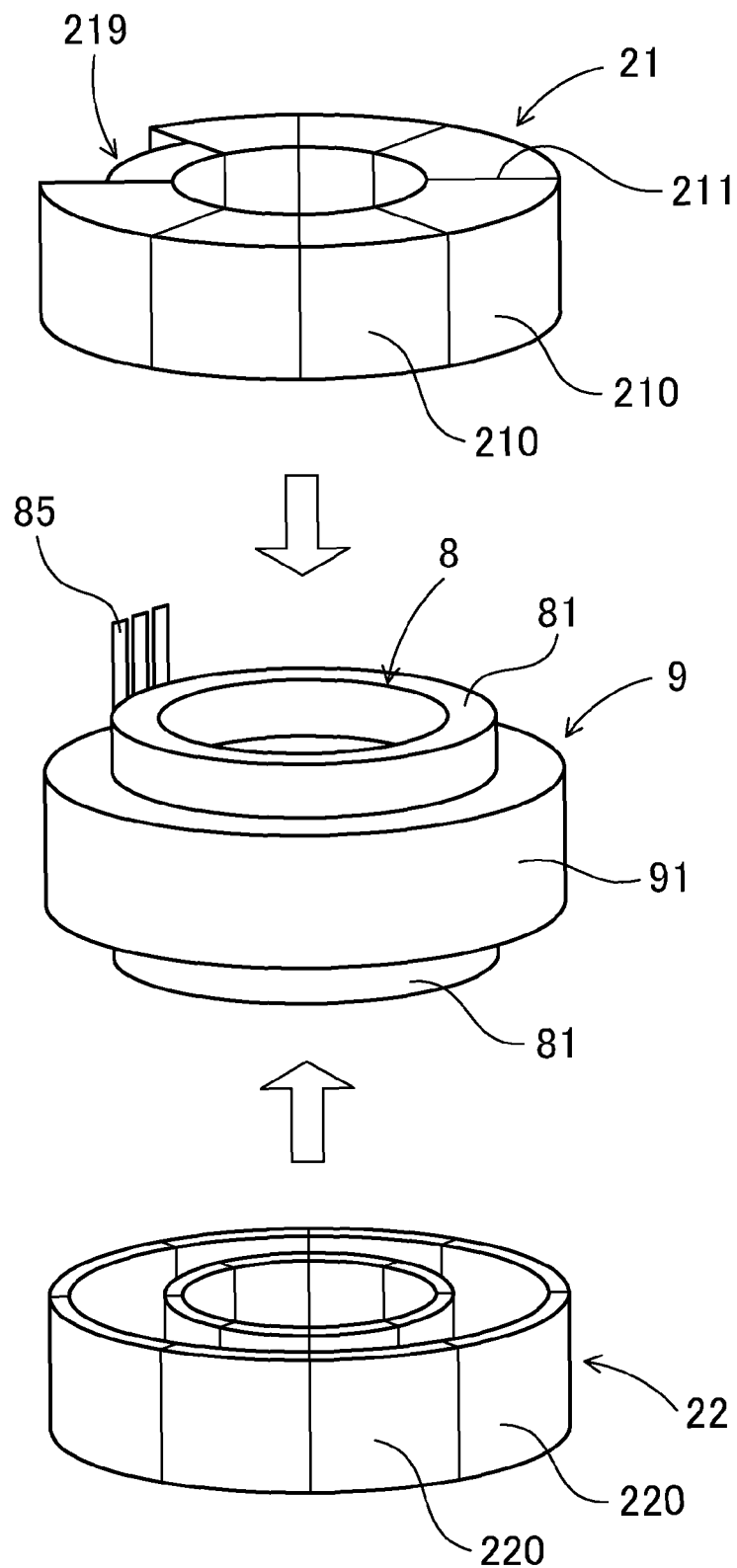
FIG. 2 is an illustrative view showing the constitution of an electrode according to the first embodiment.

As shown in FIG. 1, an insulation coated conductor inspection apparatus 1 according to this embodiment is an insulation coated conductor inspection apparatus for inspecting an electrical insulation characteristic of an insulation coated conductor in a coil 8 formed by winding the insulation coated conductor. In this embodiment, as shown in FIGS. 1 and 2, an assembly (a stator 9) formed by attaching the coil 8 to a stator core 91 serves as an inspection subject.

The insulation coated conductor inspection apparatus 1 includes a test container 10 accommodating the coil 8, and a pressure reducing unit 11 for reducing the internal pressure of the test container 10. A vacuum pump that is connected to the test container 10 via a pipe 110 is used as the pressure reducing unit 11. Further, electrodes 21, 22 are provided in the test container 10 so as to face the coil 8 with a gap therebetween. A voltage applying unit 12 for applying an alternating-current voltage between the electrodes 21, 22 and the coil 8 and a discharge measuring unit 13 for measuring a charge amount of a discharge generated between the coil 8 and the electrodes 21, 22 when the alternating-current voltage is applied and a generation frequency thereof are provided on the outside of the test container 10. In this embodiment, a corona discharge measuring instrument doubles as a power source of the voltage applying unit 12 and the discharge measuring unit 13.

Further, a determining unit 14 for determining that a product has a superior electrical insulation property when the discharge generation frequency at a charge amount within a predetermined range is higher than a reference generation frequency and determining that a product has a defective electrical insulation property when the discharge generation frequency is lower than the reference generation frequency is connected to the discharge measuring unit 13. Note that in this embodiment, a voltage waveform measuring instrument 15 for measuring a voltage waveform during discharge is disposed parallel to the discharge measuring unit 13.

The determining unit 14 receives data relating to the discharge charge amount and the generation frequency thereof from the discharge measuring unit 13, and makes a determination using a predetermined reference. In this embodiment, a personal computer is used and results are displayed on a display thereof Note that the determining unit 14 may take various forms and the conditions under which the determination is made may be modified in various ways using software.

Further, the stator 9 which serves as the inspection subject in this embodiment is formed by attaching the coil 8 to the stator core 91 such that a coil end portion 81 projects from either end of the stator core 91. Moreover, as shown in FIGS. 1 and 2, a lead portion 85 for connecting the coil 8 to an external power source is disposed on the coil end portion 81 side that is positioned on the upper side of the stator core 91.

As shown in FIGS. 1 and 2, the electrodes 21, 22 of this embodiment are provided in a ring shape so as to surround the entire periphery of the coil end portion 81 that projects from the end portion of the stator core 91, and have a substantially C-shaped cross-section. Further, the electrode 21 disposed on the upper side is provided with a notch portion 219 so as not to interfere with the lead portion 85.

Further, each electrode 21, 22 is divided into eight segments in a circumferential direction, and an insulating material 211 is sandwiched between the respective segments such that a voltage can be applied in units of divided electrodes 210, 220. By modifying the electrode 210, 220 to which the voltage is applied sequentially, the test site can be changed. In so doing, a damaged site of the coil end portion 81 can be specified.

Further, as shown in FIG. 1, the voltage applying unit 12 and the discharge measuring unit 13 are connected to the lead portion 85 of the coil 8 via an electric wire 121 and connected to the electrode 21 or the electrode 22 via an electric wire 122, a switch portion 125, and an electric wire 211 or 221. The divided electrodes 210, 220 of the electrodes 21, 22 to which the voltage is applied may be switched using a switching unit not shown in the drawings.

Further, by applying a voltage to a U phase, a V phase, and a W phase of the three-phase coil 8 attached to the stator core 91 individually, without connecting a neutral point of the coil 8, a damaged phase of the coil can be determined. Moreover, by modifying the electrode to which the voltage is applied according to the divided electrode 210, 220, a location of the damage in the damaged phase of the coil can be determined.

Furthermore, by applying a voltage to the lead portion 85 side and the opposite side to the lead portion 85 side separately, it is possible to determine whether damage has occurred on the lead portion 85 side or the opposite side to the lead portion 85 side.

Figure 3:
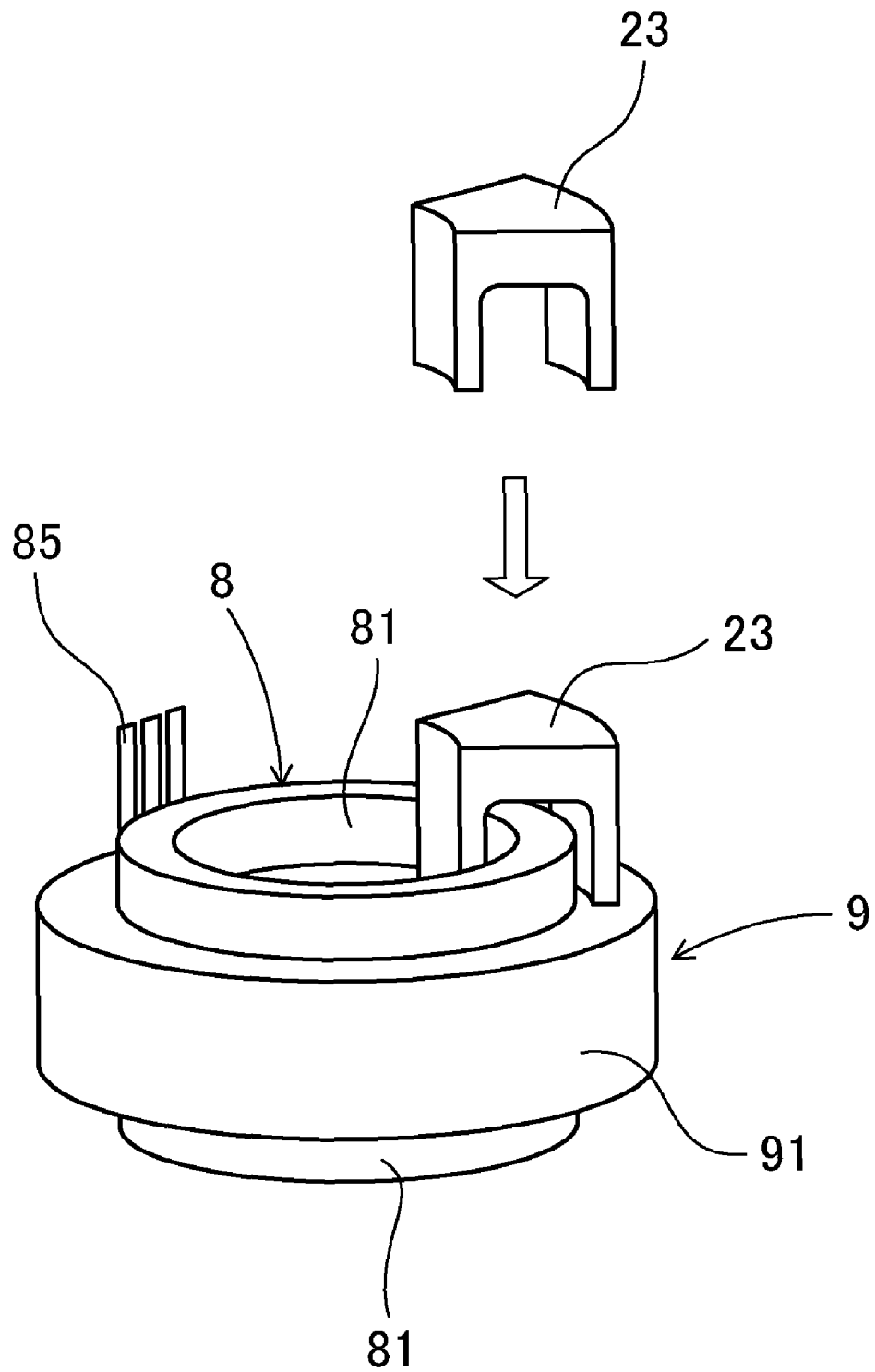
FIG. 3 is an illustrative view showing another example of the constitution of the electrode according to the first embodiment.

As shown in FIG. 3, a C-shaped small electrode 23 that faces only a part of the circumferential direction of the coil end portion 81 may be employed as an electrode. In this case, the test site can be modified by making the small electrode 23 capable of movement relative to the coil 8 and causing the electrode 23 to perform a relative movement.

Next, examples of results obtained when an insulation coated conductor inspection was performed using the insulation coated conductor inspection apparatus 1 described above will be described.

First, as shown in FIG. 1, the coil 8 attached to the stator core 91 was disposed in the test container 10, whereupon the internal pressure of the test container 10 was reduced to a reduced pressure of 400 (Pa).

Further, the electrodes 21, 22 were disposed in the test container 10 so as to face the coil 8 with a gap therebetween. The gap was set within a range of 3 to 30 mm.

Figure 4:
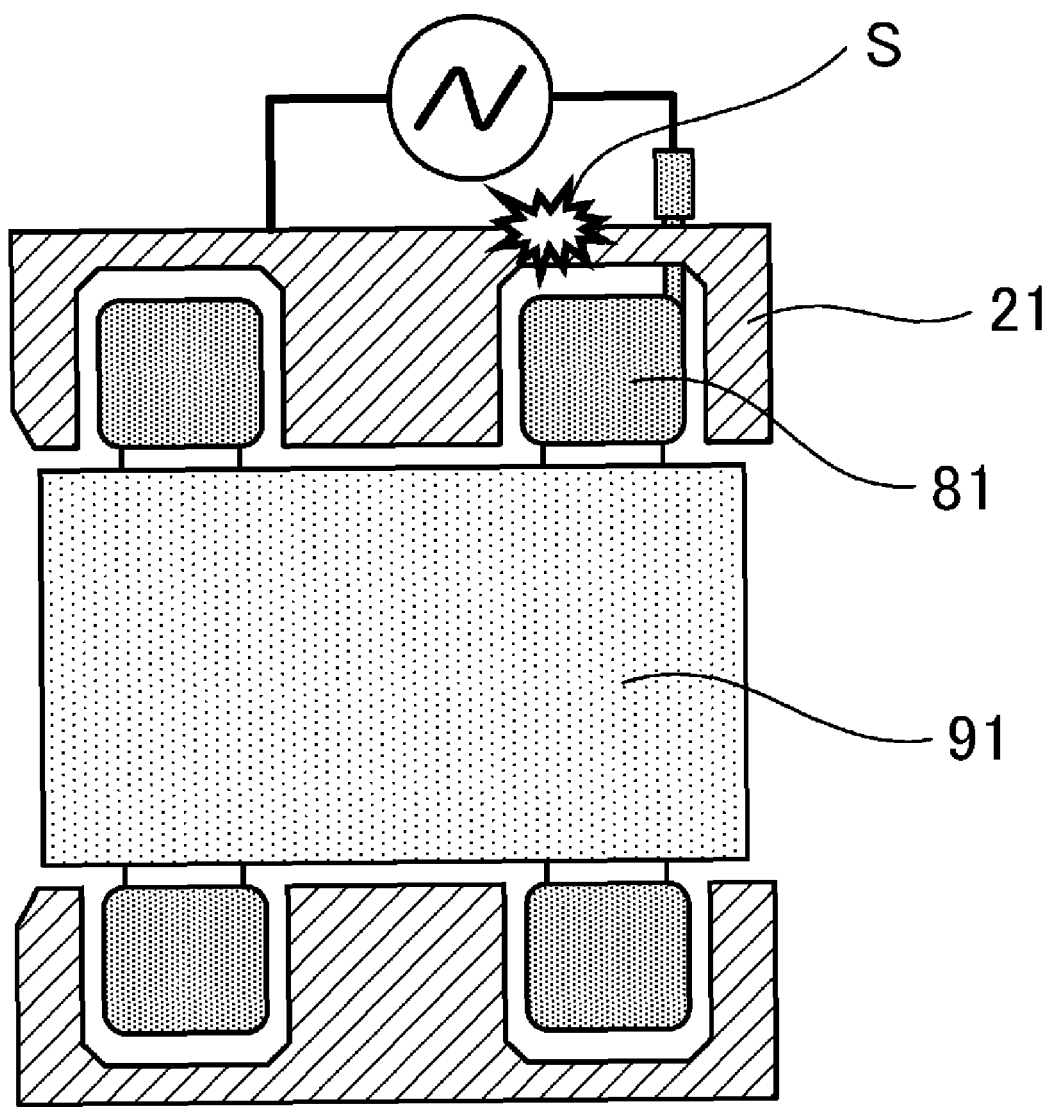
FIG. 4 is an illustrative view showing a discharge generation position according to the first embodiment.

Next, an alternating-current voltage was applied between one divided electrode 210 of the electrode 21 and the coil 8, whereupon the charge amount of the discharge generated between the coil and the electrode upon application of the alternating-current voltage and the generation frequency thereof were measured. Voltage application conditions were set at a voltage of 480V, an application period of 0.5 seconds, and a secondary current set value of 24 mA. The secondary current set value is a set value for protecting the power source of the voltage applying unit 12, and when the current exceeds 24 mA, application of the alternating-current voltage is stopped. When a discharge is generated, current flows rapidly, and therefore the secondary current set value is preferably set to be smaller than 30 mA in order to protect the power source. In this embodiment, as shown in FIG. 4, the electrode 21 is disposed to surround the coil end portion 81, and therefore a discharge S is generated between the electrode 21 and the coil end portion 81.

After generating a discharge through voltage application in this manner, an experiment was implemented to measure the charge and generation frequency of the discharge generated within one second. The experiment was performed a plurality of times in relation to each of a non-defective product in which the absence of damage to the electrical insulation property had been confirmed in advance and a damaged product having a partially damaged insulating film, and average values thereof were determined.

Figure 5:
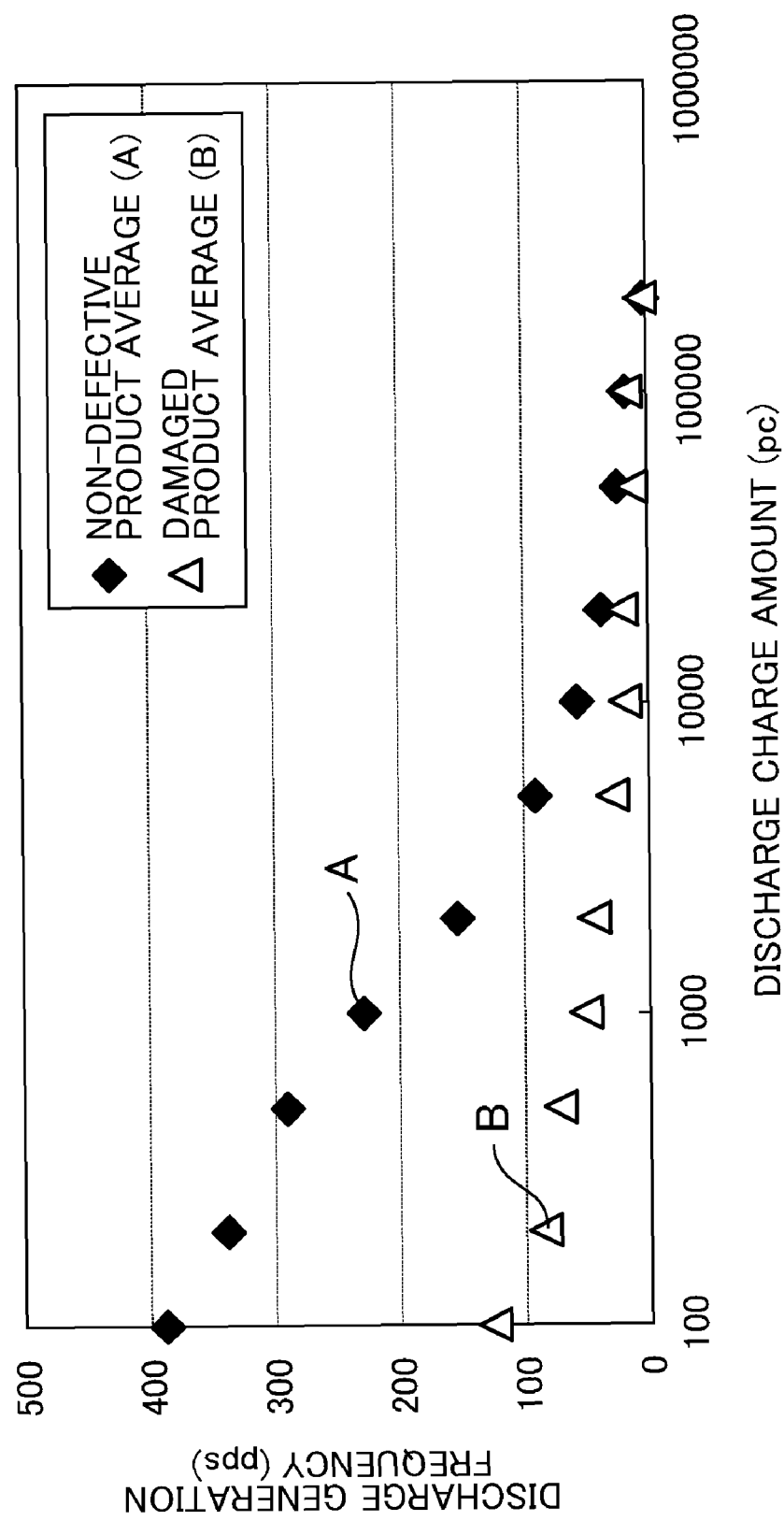
FIG. 5 is an illustrative view showing a relationship between a discharge charge amount and a discharge generation frequency according to the first embodiment.

The measurement results are shown in FIG. 5. In the drawing, the abscissa shows the discharge charge amount (pc) and the ordinate shows the discharge generation frequency per second (pps). Non-defective product average values (A) and damaged product average values (B) obtained as a result of the plurality of experiments were plotted.

As is evident from the drawing, when the apparatus and method according to the present invention are used, the discharge generation frequency of the non-defective product increases as the discharge charge amount decreases. This characteristic can be employed to differentiate between non-defective products having a superior electrical insulation property and defective products having a defective electrical insulation property according to whether the discharge generation frequency at a charge within a predetermined range is higher or lower than a reference generation frequency. More specifically, a discharge generation frequency (pps) of 150 at 1000 (pc) may be used as the reference such that products having at least this discharge generation frequency are determined to be non-defective and products having a lower discharge generation frequency are determined to be defective. Further, a discharge generation frequency at 100 to 1000 (pc) may be set as the reference, or the reference may be set in relation to a total discharge generation frequency including all ranges. Note, however, that in this example, the difference between a non-defective product and a damaged product becomes small when the charge exceeds 10,000 (pc), and therefore the range is preferably set at or below this value.

(Comparative Experiment)

To clarify the superiority of the first embodiment further, a comparative experiment was performed using a conventional method (a method conforming to Japanese Patent Application Publication JP-A-H7-128392) that differs from the present invention.

Figure 6:
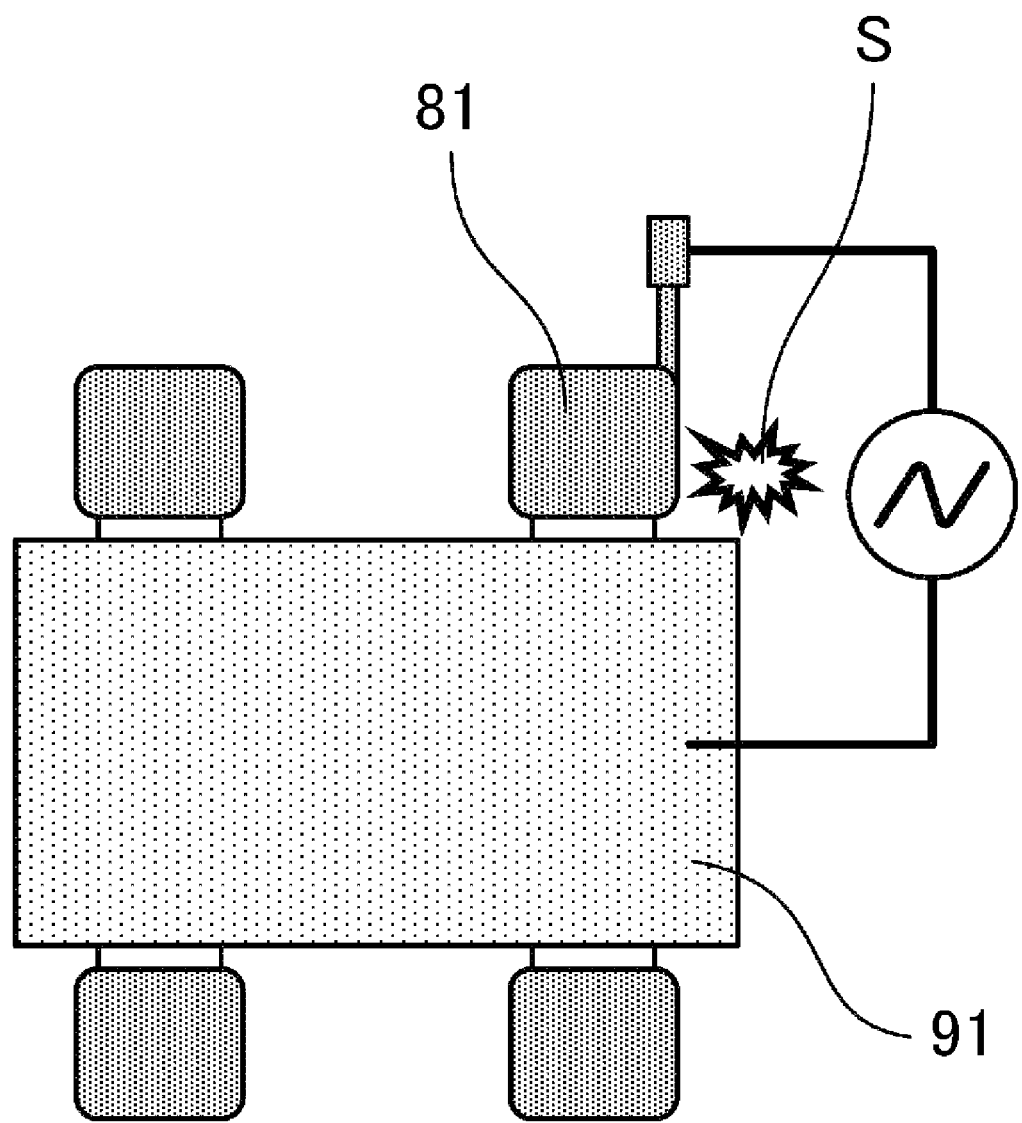
FIG. 6 is an illustrative view showing a discharge generation position according to a comparative experiment.

As shown in FIG. 6, in the comparative experiment, an alternating-current voltage was applied between the stator core 91 of the stator 9 and the coil 8 under reduced pressure without using electrodes to generate a discharge between the stator 9 and the coil 8, whereupon a corona discharge measuring instrument was used to determine the discharge charge amount (pc) and the discharge generation frequency (pps) in a similar manner to the first embodiment. The reduced pressure condition was set at 2666 Pa, and the voltage application conditions were set at a voltage of 800V, an application period of 0.5 seconds, and a secondary current set value of 24 mA. The experiment was performed a plurality of times in relation to each of a non-defective product in which the absence of damage to an electrical insulation property had been confirmed in advance and a damaged product having a partially damaged insulating film, and average values thereof were determined.

Figure 7:
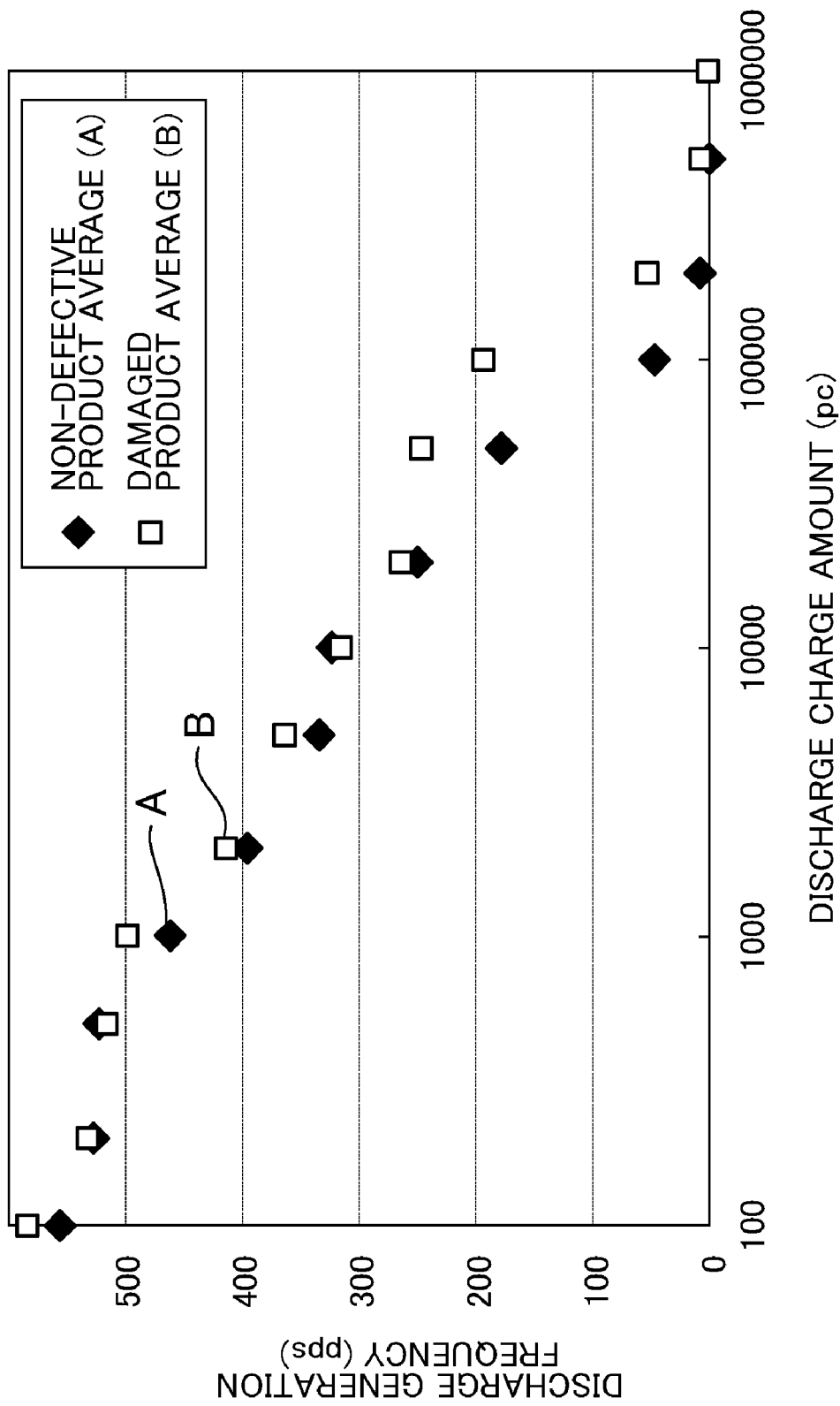
FIG. 7 is an illustrative view showing the relationship between the discharge charge amount and the discharge generation frequency according to the comparative experiment.

The measurement results are shown in FIG. 7. In the drawing, the abscissa shows the discharge charge amount (pc) and the ordinate shows the discharge generation frequency per second (pps). Non-defective product average values (A) and damaged product average values (B) obtained as a result of the plurality of experiments were plotted.

As is evident from the drawing, in the case of the comparative experiment, the greatest difference in frequency appears at a discharge charge amount of approximately 100,000 (pc) and above, and the damaged product exhibits a higher generation frequency. Hence, when the generation frequency at this large discharge charge is high, it can be determined that the electrical insulation property is defective.

However, when the method of the present invention, shown in FIG. 5, is compared to the comparative experiment shown in FIG. 7, the difference between the non-defective product (A) and the damaged product (B) is clearer over a wider range with the method of the present invention, and therefore a greater degree of determination precision is obtained.

Further, with the method of the present invention, a test can be performed at a lower voltage, and therefore damage to the coil caused by a high-voltage load can be reduced.

What is claimed is:

1. An insulation coated conductor inspection method for inspecting an electrical insulation characteristic of an insulation coated conductor in a coil formed by winding the insulation coated conductor, comprising:
   disposing the coil in a test container;
   reducing an internal pressure of the test container;
   providing an electrode so as to face the coil with a gap therebetween;
   applying an alternating-current voltage between the electrode and the coil;
   measuring a generation frequency of a discharge that is generated between the coil and the electrode upon application of the alternating-current voltage; and
   determining that the coil is a non-defective product having a superior electrical insulation property when the generation frequency of the discharge is higher than a reference generation frequency and that the coil is a defective product having a defective electrical insulation property when the generation frequency of the discharge is lower than the reference generation frequency.

2. The insulation coated conductor inspection method according to claim 1, wherein the coil is attached to a stator core.

3. The insulation coated conductor inspection method according to claim 2, wherein the electrode faces a coil end portion protruding from an end portion of the stator core, and the generation frequency of a discharge generated between the coil end portion and the electrode is measured.

4. The insulation coated conductor inspection method according to claim 3, wherein the electrode is formed with a substantially C-shaped cross-section so as to surround the coil end portion.

5. The insulation coated conductor inspection method according to claim 3, wherein application of the alternating-current voltage between the electrode and the coil is performed on the coil a plurality of times while partially shifting a test site such that the determination is performed in each test site.

6. The insulation coated conductor inspection method according to claim 3, wherein a discharge charge amount of the discharge is measured, and the generation frequency is measured within a range in which the discharge charge amount is no greater than 100,000 (pc).

7. The insulation coated conductor inspection method according to claim 3, wherein a discharge charge amount of the discharge is measured, and the generation frequency is measured within a range in which the discharge charge amount is no greater than 10,000 (pc).

8. An insulation coated conductor inspection apparatus for inspecting an electrical insulation characteristic of an insulation coated conductor in a coil formed by winding the insulation coated conductor, comprising:
a test container accommodating the coil;
a pressure reducing unit for reducing an internal pressure of the test container;
an electrode that faces the coil with a gap therebetween;
a voltage applying unit for applying an alternating-current voltage between the electrode and the coil;
a discharge measuring unit for measuring a generation frequency of a discharge that is generated between the coil and the electrode upon application of the alternating-current voltage; and
a determining unit for determining that the coil is a non-defective product having a superior electrical insulation property when the generation frequency of the discharge is higher than a reference generation frequency and that the coil is a defective product having a defective electrical insulation property when the generation frequency of the discharge is lower than the reference generation frequency.

9. The insulation coated conductor inspection apparatus according to claim 8, wherein the coil is attached to a stator core.

10. The insulation coated conductor inspection apparatus according to claim 9, wherein the electrode faces a coil end portion protruding from an end portion of the stator core, and the generation frequency of a discharge generated between the coil end portion and the electrode is measured.

11. The insulation coated conductor inspection apparatus according to claim 10, wherein the electrode is formed with a substantially C-shaped cross-section so as to surround the coil end portion.

12. The insulation coated conductor inspection apparatus according to claim 10, wherein application of the alternating-current voltage between the electrode and the coil is performed on the coil a plurality of times while partially shifting a test site such that the determination is performed in each test site.

13. The insulation coated conductor inspection apparatus according to claim 12, wherein the electrode faces a part of the coil and is capable of moving relative to the coil such that the test site can be modified by causing the electrode to move relative to the coil.

14. The insulation coated conductor inspection apparatus according to claim 12, wherein the electrode is divided into a plurality of divided electrodes such that the test site can be modified by modifying the electrode to which the voltage is applied successively.

15. The insulation coated conductor inspection apparatus according to claim 10, wherein the discharge measuring unit measures a discharge charge amount of the discharge, and measures the generation frequency within a range in which the discharge charge amount is no greater than 100,000 (pc).

16. The insulation coated conductor inspection apparatus according to claim 10, wherein the discharge measuring unit measures a discharge charge amount of the discharge, and measures the generation frequency within a range in which the discharge charge amount is no greater than 10,000 (pc).

* * * * *